(12) United States Patent
Correale, Jr. et al.

(10) Patent No.: US 7,619,923 B2
(45) Date of Patent: Nov. 17, 2009

(54) APPARATUS FOR REDUCING LEAKAGE IN GLOBAL BIT-LINE ARCHITECTURES

(75) Inventors: Anthony Correale, Jr., Raleigh, NC (US); Rahul K. Nadkarni, Greenville, IN (US)

(73) Assignee: International Business Machines Corporation, Armonk, NY (US)

( * ) Notice: Subject to any disclaimer, the term of this patent is extended or adjusted under 35 U.S.C. 154(b) by 151 days.

(21) Appl. No.: 11/950,459

(22) Filed: Dec. 5, 2007

(65) Prior Publication Data

US 2009/0147590 A1     Jun. 11, 2009

(51) Int. Cl.
*G11C 11/34* (2006.01)
(52) U.S. Cl. .............. 365/185.13; 365/198; 365/189.05
(58) Field of Classification Search ............ 365/185.13, 365/198, 189.05, 190, 202, 230.08, 189.03, 365/207
See application file for complete search history.

(56) References Cited

U.S. PATENT DOCUMENTS 5,504,709 A * 4/1996 Yabe et al. ............. 365/189.05
5,862,074 A * 1/1999 Park ...................... 365/185.03

\* cited by examiner

*Primary Examiner*—Dang T Nguyen
(74) *Attorney, Agent, or Firm*—Cantor Colburn LLP; Mark McBurney

(57) ABSTRACT

A circuit for reducing current leakage in hierarchical bit-line architectures includes a sense amplifier having transistors, the sense amplifier coupled to bit-lines of cells in a memory array, the sense amplifier configured for detecting stored data from one of the cells; an output latch having transistors, the output latch selectively coupled to a global bit-line of the sense amplifier having a logical state, the output latch configured for selectively reading out stored data from one of the cells through the global bit-line; and a transmission gating device coupled between the sense amplifier and the output latch for selectively coupling the sense amplifier to the output latch correspondingly eliminating a first leakage path and forming a second leakage path, the first leakage path being between the sense amplifier and the output latch, the second leakage path formed within the sense amplifier.

5 Claims, 5 Drawing Sheets

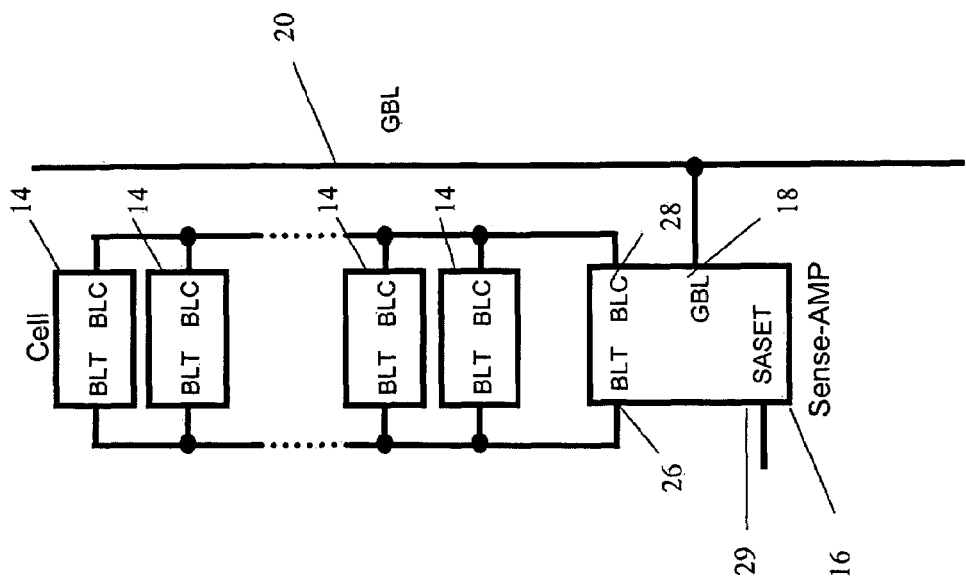
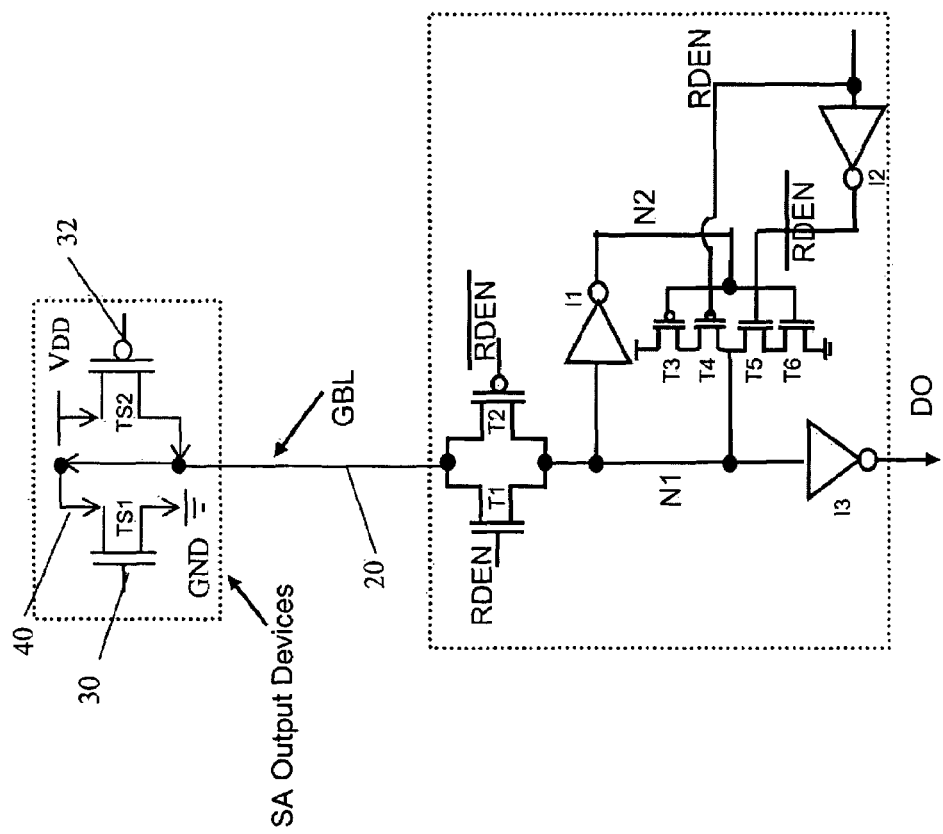
FIG. 4
FIG. 3

APPARATUS FOR REDUCING LEAKAGE IN GLOBAL BIT-LINE ARCHITECTURES

BACKGROUND OF THE INVENTION

1. Field of the Invention

This invention relates to integrated circuits, and particularly to integrated circuits for reducing leakage in global bit-line architectures.

2. Description of Background

As feature size gets smaller and smaller, static power is becoming a bigger and bigger component of the total power. This is evident in the 90 nanometer (nm) technology and even more so in 65 nm technology. In the 65 nm technology, static power is expected to be a bigger component of total power than the dynamic power even at the fastest speeds. To keep products competitive, it becomes necessary to use low threshold-voltage (LVT) devices in circuit paths to improve performance. At the same time, the static power needs to be kept to a manageable level.

SUMMARY OF THE INVENTION

The shortcomings of the prior art are overcome and additional advantages are provided through the provision of a circuit for reducing current leakage in hierarchical bit-line architecture. The circuit comprising: a sense amplifier having a first plurality of transistors, the sense amplifier coupled to bit-lines of a plurality of memory cells in a memory array, the sense amplifier configured for detecting stored data from one of the plurality of memory cells; an output latch having a second plurality of transistors, the output latch selectively coupled to a global bit-line of the sense amplifier having a logical state, the output latch configured for selectively reading out stored data from one of the plurality of memory cells through the logical state of the global bit-line; and a transmission gating device coupled between the sense amplifier and the output latch for selectively coupling the sense amplifier to the output latch correspondingly eliminating a first leakage path and forming a second leakage path, the first leakage path being between the sense amplifier and the output latch, the second leakage path formed within the sense amplifier.

Additional features and advantages are realized through the techniques of the present invention. Other embodiments and aspects of the invention are described in detail herein and are considered a part of the claimed invention. For a better understanding of the invention with advantages and features, refer to the description and to the drawings.

Technical Effects

As a result of the summarized invention, technically we have achieved a solution for reducing leakage in global bit-line architectures by incorporating a transmission-gating device between a sense amplifier and a data output latch.

BRIEF DESCRIPTION OF THE DRAWINGS

The subject matter, which is regarded as the invention, is particularly pointed out and distinctly claimed in the claims at the conclusion of the specification. The foregoing and other objects, features, and advantages of the invention are apparent from the following detailed description taken in conjunction with the accompanying drawings in which:

FIG. 3 illustrates a schematic diagram of one of a plurality of sense amplifiers of the integrated circuit being coupled to a transmission-gating device and a data output latch of the integrated device in accordance with one exemplary embodiment of the present invention;

FIG. 4 illustrates a schematic diagram of one of the plurality of sense amplifiers of the integrated circuit being coupled to one or more of a plurality of cells within the memory array in accordance with one exemplary embodiment of the present invention;

Figure 1:
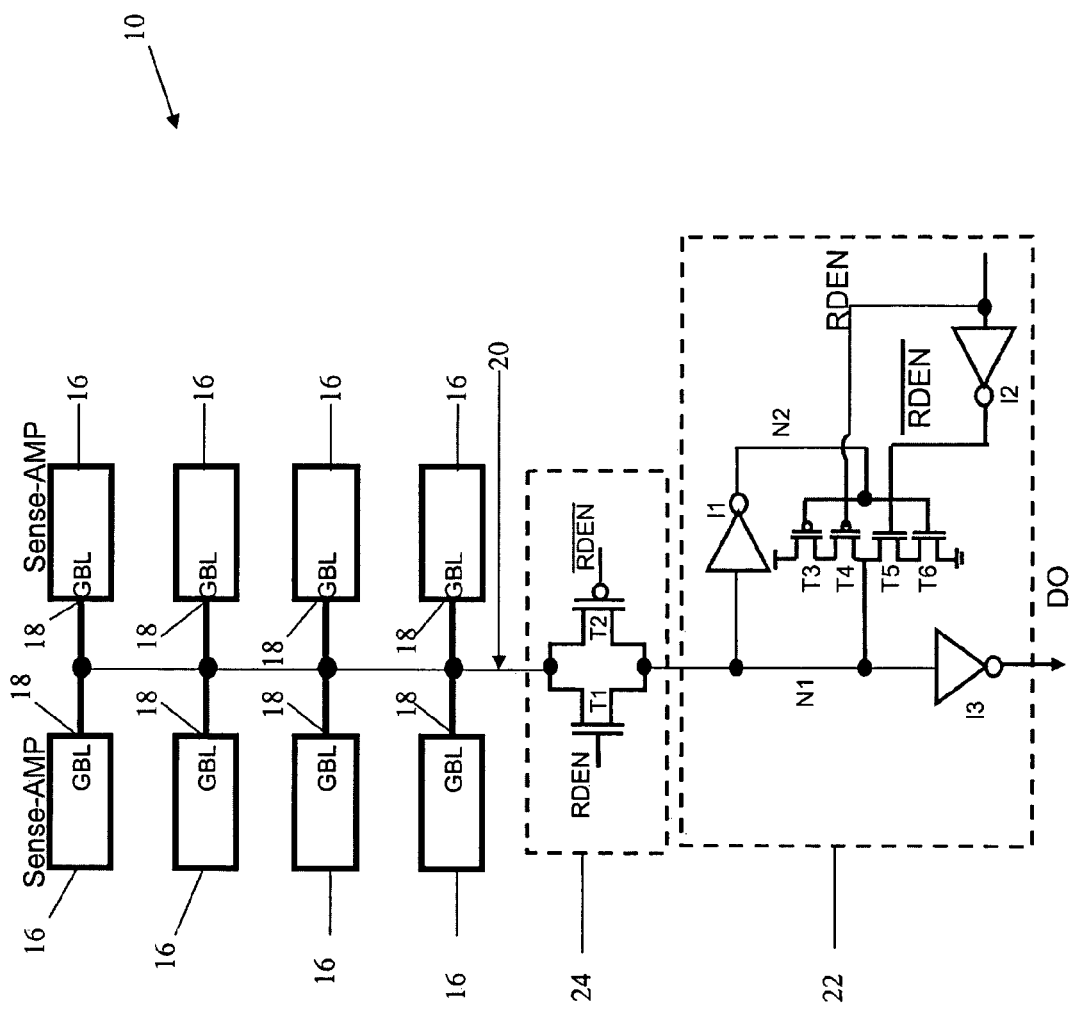
FIG. 1 illustrates a schematic diagram of an integrated circuit in accordance with one exemplary embodiment of the present invention.

The detailed description explains the preferred embodiments of the invention, together with advantages and features, by way of example with reference to the drawings.

DETAILED DESCRIPTION OF THE INVENTION

For purposes of the present invention embodiments, the terms "memory array", "memory device", "array", and "sub-array" may be considered as equivalent terms. Furthermore, for the purposes of the present invention embodiments, the term "leakage" is intended to describe as current leakage or leakage power or static power. It should be understood that the structure of P-Channel Field Effect Transistors (PFETs) and N-Channel Field Effect Transistors (NFETs) used in exemplary embodiments of the present invention in their simplest form include a gate electrode over a gate dielectric over a channel region in a semiconductor substrate with a source and a drain formed in the substrate on opposite sides of the channel region. It is contemplated that other structurally complex PFETs and NFETs as known in the art may be used in exemplary embodiments of the present invention.

The inventors herein have recognized that incorporating a transmission-gating device between a global bit-line of a number of sense amplifiers and a data output latch for the global-bit line eliminates existing leakage through a leakage path between the sense amplifiers and the data output latch when the sense amplifiers are disabled. In accordance with one exemplary embodiment of the present invention, incorporating the transmission-gating device as such selectively forms a predominant leakage path from a PFET of each of the sense amplifiers correspondingly through an NFET of each of the sense amplifiers. As such, predominate leakage occurs within the sense amplifiers. The current leakage that would exist through the leakage path between each of the sense amplifiers and the data output latch when the transmission-gating device is not present and when the sense amplifiers are disabled is significantly greater than the leakage through the predominant leakage path realized using the above-mentioned exemplary configuration.

The sense amplifier and the data output latch are configured for enabling a read operation through a memory device having one or more cells each containing one bit of stored data, which is fed via the global-bit line and read out from the data output latch. In one exemplary configuration, more than one sense amplifier is associated with a memory device due to the many cells disposed therein. Consequently, incorporating the transmission-gating device selectively forms a leakage path within each sense amplifier that is disabled, as described above, associated with the memory device resulting in a greater overall reduction of current leakage.

Advantageously, since the NFET of the sense amplifier determines the leakage, the PFET of sense amplifier 16 can be increased to improve rising global bit-line performance without affecting leakage. In addition, this scheme allows the use of low threshold-voltage transistors within the sense amplifier and the transmission-gating device, which slightly slows down performance while maintaining low current leakage. Advantageously, this scheme further allows the global bit-line to float between a high state and a low state, thereby improving performance/speed. This scheme further eliminates state-dependent sense-amp leakage, which will be further described.

FIG. 1 illustrates a schematic diagram of an integrated circuit 10 for reducing current leakage in global bit-line architectures in accordance with one exemplary embodiment of the present invention. As shown more particularly in FIG. 2, the integrated circuit 10 operates in conjunction with a memory array 12 having a plurality of cells 14 disposed therein, where each column of cells 14 includes dedicated bit-lines BLT and BLC. The configuration of the memory array 12 will be discussed in more detail below.

Turning back to FIG. 1, the circuit 10 includes a plurality of sense amplifiers 16 each having a dedicated global bit-line output 18, which feeds into a global bit-line 20. In other words, the global bit-line output 18 of each sense amplifier 16 feeds into the global bit-line 20. The circuit 10 further comprises a data output latch 22 and a transmission-gating device 24, which are both coupled to the sense amplifiers 16. More specifically, the data output latch 22 and the transmission-gating device 24 are coupled to the global bit-line 20 to which the global bit-line output 18 of each sense amplifier 16 feeds into. The transmission-gating device 24 is coupled between the global bit-line 20 and the data output latch 22. In one exemplary embodiment, the transmission-gating device 24 is separate from the data output latch 22 as shown. In an alternative exemplary embodiment, the transmission-gating device 24 is part of the data output latch 22 as shown in FIG. 3.

Figure 2:
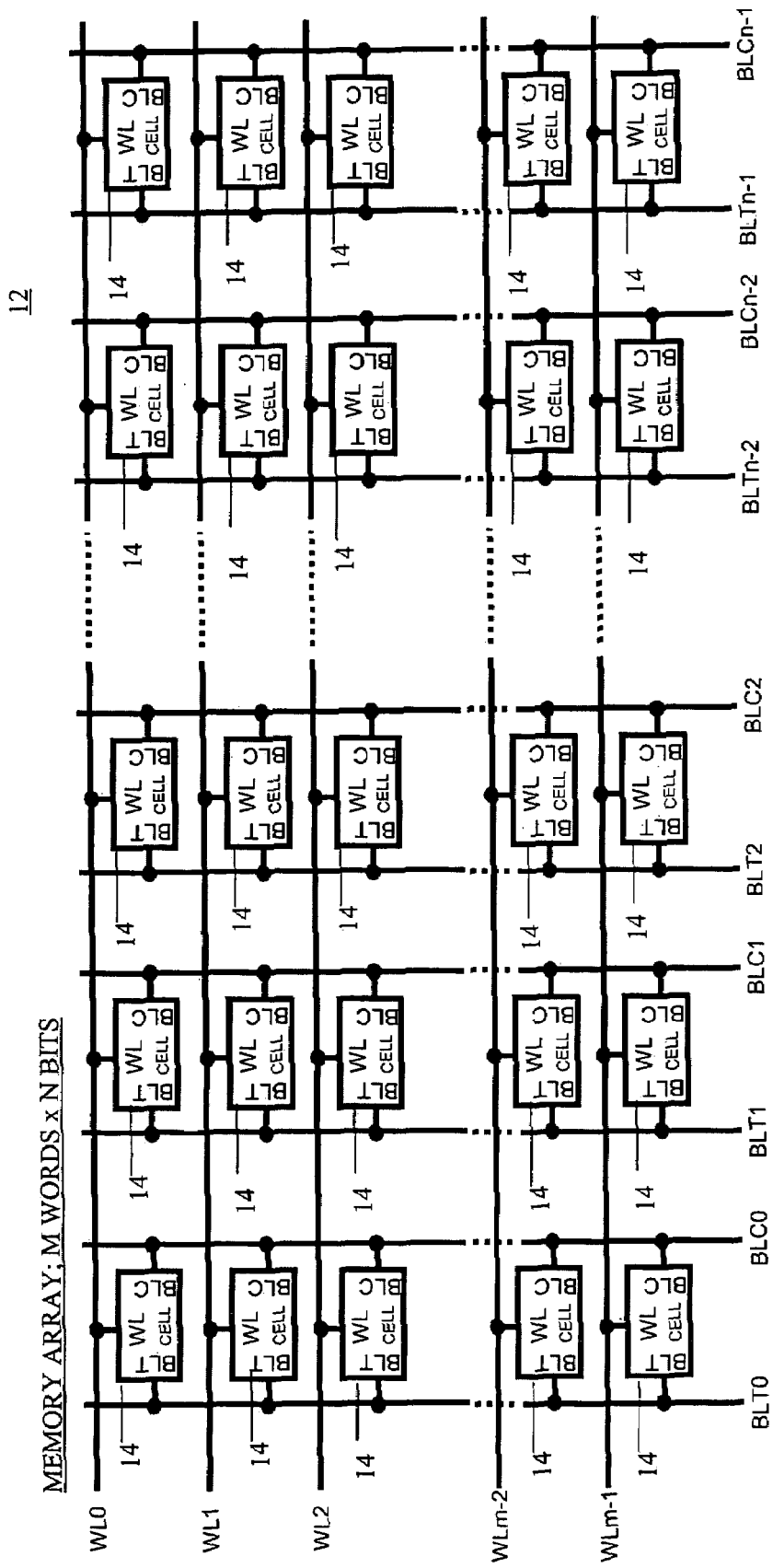
FIG. 2 illustrates a schematic diagram of a memory array that operates in conjunction with the integrated circuit in accordance with one exemplary embodiment of the present invention.

In accordance with one exemplary embodiment, the circuit 10 is used in conjunction with the memory array 12. The memory array 12 shown in FIG. 2 includes a number of memory cells 14 organized in rows and columns and correspondingly multiple word lines and bit lines. The memory array 12 includes M word-lines and N bit-lines. For example, the size of memory array 12 is 128 WL×128 BL. Of course, memory array 12 may be of any size and should not be limited to the size illustrated. It should be understood that memory array 12 may comprise of a hierarchy of memory arrays having memory cells for storing a bit of information in various configurations. The hierarchy as shown in FIG. 2 is exemplary in nature and should not be limiting. In one non-limiting exemplary embodiment, memory array 12 is a Static Random Access Memory (SRAM). Of course, other types of semiconductor memory may be used in other exemplary embodiments of the present invention.

In accordance with one exemplary embodiment, each memory cell 14 has corresponding bit-lines (BLT and BLC), where BLT is the true bit-line output of the respective cell while BLC is the complement bit-line output of the same respective cell. For example, if cell 14 contains a "1", then the BLT of cell 14 is "1" and the BLC of cell 14 is "0" when the cell is addressed/read activated. The BLT and BLC of each cell 14 in the same column within memory array 12 are correspondingly coupled to one of the sense amplifiers 16. For example, the BLT and BLC of each cell in the first column (column 0) are coupled to one of the sense amplifiers 16, the BLT and BLC of each cell in the second column (column 1) are coupled to another one of the sense amplifiers 16, and so forth. Consequently, the cells in each respective column of the memory array 12 have a dedicated sense amplifier. Of course, more than one column may be associated with one sense amplifier and should not be limited to the configuration described above.

In accordance with one exemplary embodiment, the circuit 10 includes a number of sense amplifiers 16 each dedicated to a number of the plurality of cells 14 within the memory array 12. For example, circuit 10 includes 8 sense amplifiers for memory array 12 holding 512 cells as shown in FIG. 1. In this example, eight groups of 64 cells are provided, where each group has an associated sense amplifier 16. Each of the sense amplifiers 16 feed into global bit-line 20. The global bit-line 20 then feeds into the transmission-gating device 24 then to the data output latch 22 accordingly. Of course, in other exemplary embodiments, circuit 10 includes more or less than 8 sense amplifiers each containing more or less than 64 cells. As previously mentioned, the bit-line hierarchy can be extended to other configurations than the configuration shown in FIG. 1. For ease of discussion, however, only 8 sense amplifiers are illustrated in FIG. 1 along with the associated global bit-line 20 and data output latch 22 coupled thereto. Thus, the configuration as shown in FIG. 1 is exemplary in nature and should not be limiting.

In accordance with one exemplary embodiment, the sense amplifiers 16 are each configured for detecting stored data from the associated memory cells. More specifically, the sense amplifiers 16 are each configured for reading the state (a logical 0 or a logical 1) of one of the respective memory cells 14 in memory array 12. In one exemplary embodiment, each of the sense amplifiers 16 can be any conventional sense amplifier and should not be limited to any particular type.

Referring now to FIG. 4, the features of each sense amplifier are illustrated in further detail. For simplistic purposes, only one sense amplifier 16 coupled to global bit-line 20 is illustrated and will be discussed in detail. However, it should be understood that more than one sense amplifier is coupled to global bit-line 20, such as, for example, eight sense amplifiers as previously shown in FIG. 1. During a read operation, only one sense amplifier is enabled for driving global bit-line 20 while the other sense amplifiers are disabled. Sense amplifier 16 includes a BLT input 26 and a BLC input 28 correspondingly coupled to the BLT node and the BLC node of each memory cell in the respective column of the memory array. The BLT input 26 and the BLC input 28 of sense amplifier 16 are configured for detecting stored information from one of the cells in the respective column of the memory array 12 and sending such data through the global bit-line output 18, which feeds into global bit-line 20. The sense amplifier 16 further includes a control input 29 for receiving a control signal (SASET). The control signal (SASET) operates to enable the state of the global bit-line 20 to change or allow the same to maintain its current state, which will further be described below. The control signal (SASET) is a signal generated from a clock signal (not shown) during a read operation.

The sense amplifier 16 further includes controlling output devices configured for placing the sense amplifier 16 in an enabled or disabled state based on the control signal (SASET) as shown in FIG. 3. Of particular interest, sense amplifier 16 includes transistor devices TS1 and TS2 along with other conventional components associated with conventional sense amplifiers. In one embodiment, transistor device TS1 is an NFET and transistor device TS2 is a PFET, which are both coupled to the global bit-line 20. Transistor device TS2 is further coupled to a power source $V_{DD}$ while transistor device TS1 is coupled to a common ground GND. In one non-limiting embodiment, transistor device TS1 and TS2 are low threshold-voltage (LVT) transistors resulting in an improvement in speed within the circuit. To afford performance improvements as a function of off-state leakage, the threshold voltages of the transistors can be manufactured with a variety of channel implantations (dosage). It is common for a technology supplier to offer several devices with differing threshold voltages. Low, regular and high threshold-voltage devices are common classifications. Low threshold-voltage devices typically offer the fastest operation but at the sacrifices of significantly higher leakage. In one exemplary embodiment, transistor device TS1 and transistor device TS2 are coupled in series with respect to global bit-line 20 and whose outputs are dotted with one another. Transistor devices TS1 and TS2 include inputs 30 and 32 respectively. The corresponding inputs 30 and 32 of transistor devices TS1 and TS2 are coupled to other conventional devices (not shown) within sense amplifier 16 that together with transistor devices TS1 and TS2 operate and control sense amplifier 16.

In accordance with one exemplary embodiment, the transmission-gating device 24 includes transistor devices T1 and T2 having inputs for receiving signals RDEN and $\overline{\text{RDEN}}$ respectively. In one exemplary embodiment, transistor device T1 is an NFET and transistor device T2 is a PFET, which are both coupled to global bit-line 20 and coupled in parallel with respect to one another. Signal RDEN is a signal generated from the clock signal during a read operation, where signal $\overline{\text{RDEN}}$ is the complement of signal RDEN. For example, when signal RDEN is "0", signal $\overline{\text{RDEN}}$ is "1" and vice versa. In one non-limiting exemplary embodiment, transistor devices T1 and T2 are LVT transistors resulting in an improvement in speed within the circuit. As such, although incorporating the transmission-gating device 24 between the global bit-line of the sense amplifier 16 and the data output latch 22 slows down the performance of the circuit, such slowdown is minimal due to making transistor devices T1 and T2 LVT transistors. The transistor devices T1 and T2 are configured for selectively coupling global bit-line 20 to the data output latch 22, where such coupling is enabled through signal RDEN and $\overline{\text{RDEN}}$.

In accordance with one exemplary embodiment, data output latch 22 includes transistor devices T3-T6 and inverters 11-13. In one non-limiting exemplary embodiment, transistor devices T3 and 14 are PFETs while transistor devices T5 and T6 are NFETs. Signal RDEN is configured for driving inverter 12 and transistor devices T1 and T4. The output of inverter 12 ($\overline{\text{RDEN}}$) drives transistor devices T2 and T5. The transmission-gating device outputs a signal N1 for driving inverters 11 and 13 as shown. The inverter 11 outputs a signal N2 for driving transistor devices T3 and T6. The inverter 13 outputs a data output signal (DO), which is either the current state of global bit-line 20 or the previous state of global bit-line depending on the operation.

In operation, when sense amplifier 16 is disabled, control input (SASET) is placed at a logical 0, thus placing the input 30 of TS1 to "0" and the input 32 of TS2 to "1". As such, both transistor devices TS1 and TS2 are OFF when sense amplifier 16 is disabled. When sense amplifier 16 is enabled and one of the cells associated with sense amplifier 16 being read contains a "1", control input (SASET) is placed at a logical 1, thus placing the input 30 to TS1 to "1" and the input 32 to TS2 to "1". In doing so, transistor device TS1 is ON and transistor device TS2 is OFF, thereby driving global bit-line 20 to a logical 0 state. In contrast, when sense amplifier is enabled and one of the cells associated with sense amplifier 16 being read contains a "0", control input (SASET) is also at a logical 1; however, the input 30 to TS1 is "0" and the input 32 to TS2 is "0". In doing so, transistor device TS1 is OFF and transistor device TS2 is ON, thereby driving global bit-line 20 to a logical 1 state.

Figure 5:
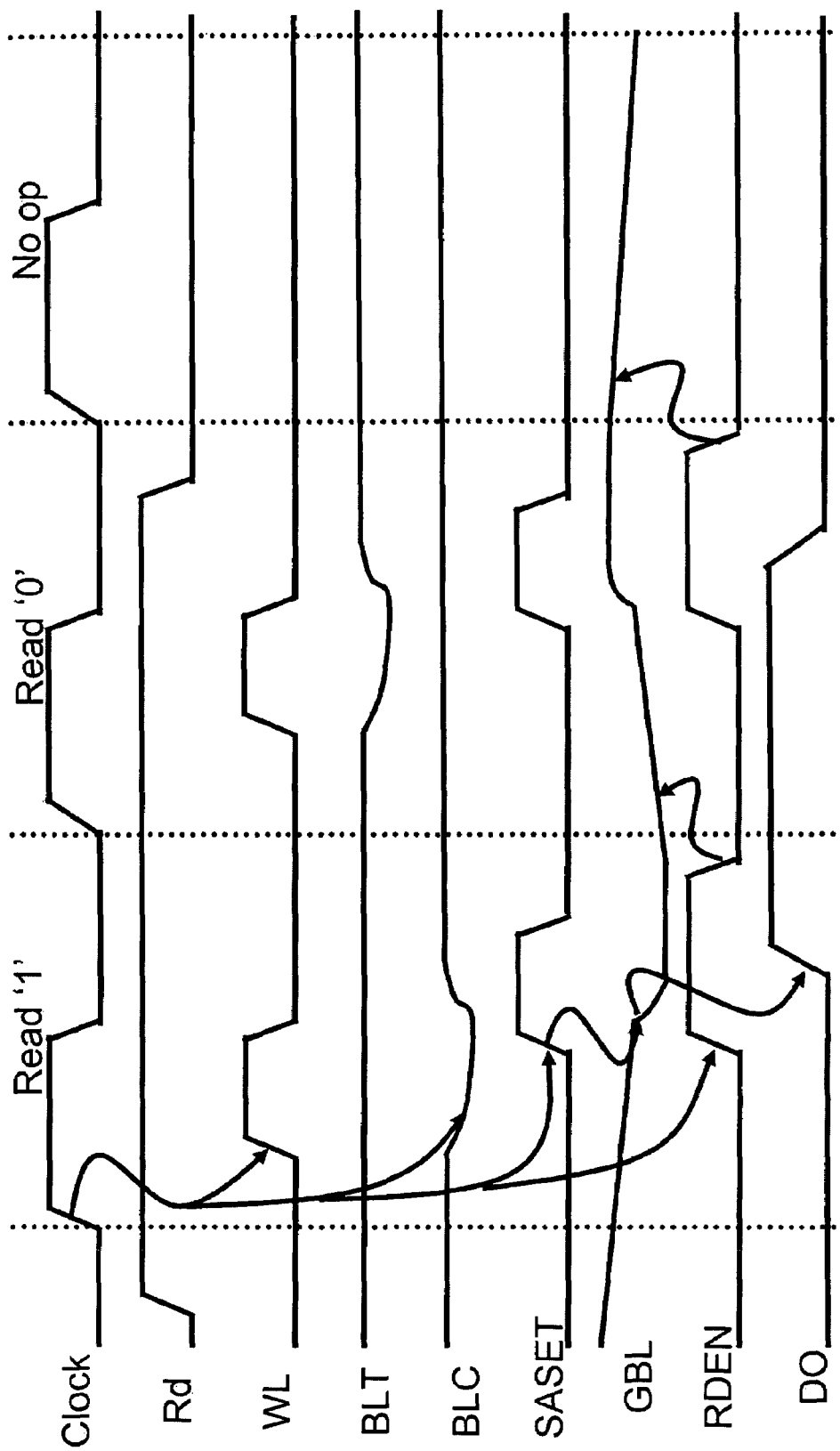
FIG. 5 illustrates a graphical representation of various signals from the integrated device and the memory array during a read operation in accordance with one exemplary embodiment of the present invention.

During standby when signal RDEN is "0", signal $\overline{\text{RDEN}}$ is "1", transistor devices T4 and T5 are turned ON while transistor devices T1 and T2 are turned OFF. As such, signal N1 is disconnected from the global bit-line 20 and is held at its value or state by transistor devices T3 through T6. This forms a current leakage path between transistor devices TS1 and TS2 of sense amplifier 16, which is indicated by arrows 40. Advantageously, the current leakage path between transistor device TS1 or TS2 of sense amplifier 16 and transistor devices T3/T4 or T5/T6 of the data output latch 22, depending on the state of the global bit-line 20, is eliminated and the predominate leakage path is within sense amplifier 16. The leakage path between transistor devices TS1 and TS2 of sense amplifier does not depend on the state of the global bit-line; rather, the predominate leakage path is formed from transistor devices TS2 to TS1 of sense amplifier when transistor devices T1 and T2 of transmission-gating device 24 are turned OFF regardless of the state of the global bit-line. During a read operation when signal RDEN is "1", signal $\overline{\text{RDEN}}$ is "0" and transistor devices T4 and T5 are turned OFF while transistor devices T1 and T2 are turned ON. As such, signal N1 gets connected to the global bit-line 20 and goes to the same value or state as the global bit-line 20. In doing so, the data output signal (DO) becomes the complement of signal N1, which is representative of the data stored in the respective cell being read. The various signals described above are illustrated in an exemplary graph in FIG. 5. More specifically, the exemplary graph illustrated in FIG. 5 illustrates various signals from the circuit 10 and the memory array 12 during a read operation. As shown, signals SASET, RDEN are generated based on the clock signal during a read operation.

In accordance with one exemplary embodiment, when transistor devices T1 and T2 of transmission-gating device 24 are turned OFF, the global bit-line 20 is essentially tri-stated or floating, as devices TS1 and TS2 are both OFF. The ultimate value of the global bit-line 20 is defined by its last state and the amount of leakage associated with the off sense amplifiers 16. Advantageously, the floating global bit-line 20 improves speed because global bit-line 20 needs to only charge or discharge from this floating value.

Figure 6:
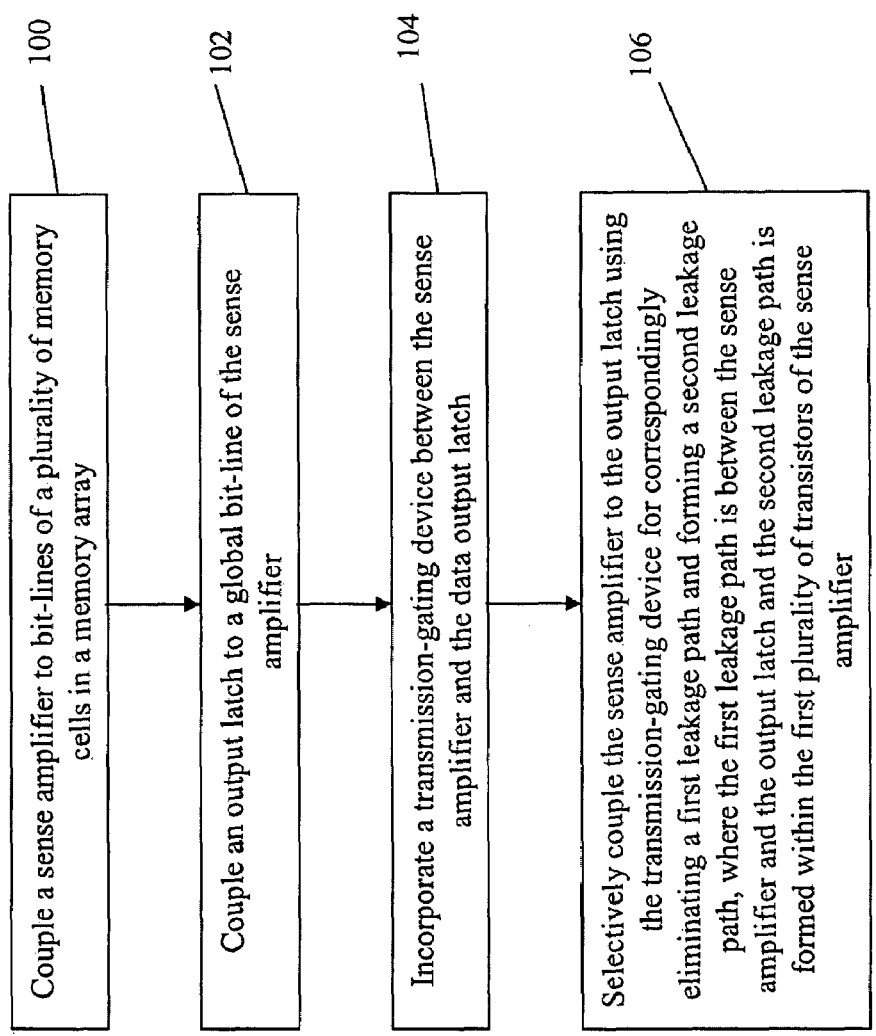
FIG. 6 illustrates a data flow diagram of an integrated circuit for reducing leakage current in global bit-line architectures in accordance with one exemplary embodiment of the present invention.

In accordance with an exemplary embodiment of the present invention, an exemplary method for reducing leakage current in global bit-line architectures is provided and illustrated in FIG. 6. In this exemplary method, couple a sense amplifier to bit-lines of a plurality of memory cells in a memory array at block 100. The sense amplifier has a plurality of transistors configured for detecting stored data from one of the plurality of memory cells. Next, couple an output latch to a global bit-line of the sense amplifier at block 102. The output latch selectively reads out stored data from one of the plurality of memory cells through the global bit-line. At block 104, incorporate a transmission-gating device between the sense amplifier and the data output latch. Then, selectively couple the sense amplifier to tile output latch using the transmission-gating device for correspondingly eliminating a first leakage path and forming a second leakage path, where the first leakage path is between the sense amplifier and the output latch and the second leakage path is formed within the first plurality of transistors of the sense amplifier at block 106.

Consequently, the first leakage path is non-existent and the leakage in the second leakage path (within the sense amplifier) is significantly smaller than the leakage that would exist in the first leakage path.

Advantageously, the exemplary embodiments of the present invention provide a circuit that achieves approximately a 62% reduction in leakage with only approximately 10 picoseconds (ps) (less than 1% access time) slow-down in performance. The low threshold-voltage option allows smaller transistors to be used for implementing the transmission-gating device. Furthermore, the transmission-gating device allows the sizes of transistors T3-T6 to be reduced because transistors T3-T6 drive signal N1 as opposed to driving the global-bit line, which has significantly higher capacitance. Therefore, circuit technique disclosed above provides no or little increase in area of the sense amplifiers 16 or the data output latch 22.

The capabilities of the present invention can be implemented in software, firmware, hardware or some combination thereof.

As one example, one or more aspects of the present invention can be included in an article of manufacture (e.g., one or more computer program products) having, for instance, computer usable media. The media has embodied therein, for instance, computer readable program code means for providing and facilitating the capabilities of the present invention. The article of manufacture can be included as a part of a computer system or sold separately.

Additionally, at least one program storage device readable by a machine, tangibly embodying at least one program of instructions executable by the machine to perform the capabilities of the present invention can be provided.

The flow diagrams depicted herein are just examples. There may be many variations to these diagrams or the steps (or operations) described therein without departing from the spirit of the invention. For instance, the steps may be performed in a differing order, or steps may be added, deleted or modified. All of these variations are considered a part of the claimed invention.

While the preferred embodiment to the invention has been described, it will be understood that those skilled in the art, both now and in the future, may make various improvements and enhancements which fall within the scope of the claims which follow. These claims should be construed to maintain the proper protection for the invention first described.

What is claimed is:

1. A circuit for reducing current leakage in hierarchical bit-line architectures, the circuit comprising:
    a sense amplifier having a first plurality of transistors, the sense amplifier coupled to bit-lines of a plurality of memory cells in a memory array, the sense amplifier configured for detecting stored data from one of the plurality of memory cells;
    an output latch having a second plurality of transistors, the output latch selectively coupled to a global bit-line of the sense amplifier having a logical state, the output latch configured for selectively reading out stored data from one of the plurality of memory cells through the logical state of the global bit-line; and
    a transmission gating device coupled between the sense amplifier and the output latch for selectively coupling the sense amplifier to the output latch correspondingly eliminating a first leakage path and forming a second leakage path, the first leakage path being between the sense amplifier and the output latch, the second leakage path formed within the sense amplifier.

2. The circuit as in claim 1, wherein the first plurality of transistors of the sense amplifier is configured for driving the logical state of the global bit-line, the first plurality of transistors includes an NFET transistor and a PFET transistor, the sizes of the plurality of transistors of the sense amplifier being optimized for power and performance.

3. The circuit as in claim 1, wherein the first plurality of transistors of the sense amplifier is chosen from a variety of available threshold-voltage options based on power and performance.

4. The circuit as in claim 1, wherein the transmission gating device includes an NFET transistor and a PFET transistor coupled in parallel with respect to one another, the transmission gating device configured for selectively enabling the logical state of the global bit-line to float between a high logical state and a low logical state when the transmission gating device is off so as to eliminate leakage through the first leakage path between the sense amplifier and the output latch.

5. The circuit as in claim 4, wherein the NFET transistor and the PFET transistor of the transmission gating device is chosen from a variety of available threshold-voltage options based on power and performance.

* * * * *